US007952881B2

(12) United States Patent
Magana et al.

(10) Patent No.: US 7,952,881 B2
(45) Date of Patent: May 31, 2011

(54) THERMAL-ELECTRICAL ASSEMBLY FOR A PORTABLE COMMUNICATION DEVICE

(75) Inventors: Salvador P. Magana, Wellington, FL (US); Dennis A. Byk, Fort Lauderdale, FL (US); Sean C. Cadogan, Weston, FL (US); Charles E. Kline, Plantation, FL (US); Arthur E. Petela, Sunrise, FL (US); Sanjay K. Roy, Miami, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 60 days.

(21) Appl. No.: 12/415,881

(22) Filed: Mar. 31, 2009

(65) Prior Publication Data

US 2010/0246137 A1 Sep. 30, 2010

(51) Int. Cl.
*H05K 7/20* (2006.01)
*H05K 9/00* (2006.01)
(52) U.S. Cl. ........ 361/719; 361/704; 361/707; 361/709; 361/720; 361/816; 361/818; 165/185; 174/16.3; 174/350; 174/377; 174/384; 174/387; 455/575.1
(58) Field of Classification Search ............. 361/679.46, 361/679.54, 688, 704, 707, 709, 714, 719–720, 361/800, 816, 818; 165/80.2, 185; 174/16, 174/3, 350, 370, 377, 384, 387, 526, 547–548
See application file for complete search history.

(56) References Cited

U.S. PATENT DOCUMENTS

| | | | |
|---|---|---|---|
| 4,621,304 A * | 11/1986 | Oogaki et al. ............. | 361/720 |
| 5,031,028 A | 7/1991 | Galich et al. | |
| 5,170,321 A | 12/1992 | Oslund et al. | |
| 5,367,434 A | 11/1994 | Griffin et al. | |
| 5,373,101 A * | 12/1994 | Barabolak ............. | 174/363 |
| 5,557,064 A | 9/1996 | Isern-Flecha et al. | |
| 5,566,052 A * | 10/1996 | Hughes ............. | 361/704 |
| 5,633,786 A * | 5/1997 | Matuszewski et al. ....... | 361/818 |
| 6,487,073 B2 * | 11/2002 | McCullough et al. ... | 361/679.54 |
| 6,744,640 B2 * | 6/2004 | Reis et al. ............ | 361/818 |
| 7,061,773 B2 * | 6/2006 | Chen ............. | 361/816 |
| 7,262,369 B1 * | 8/2007 | English ............. | 174/370 |
| 7,436,676 B2 * | 10/2008 | Higuchi et al. ............. | 361/752 |

(Continued)

FOREIGN PATENT DOCUMENTS

JP 07030280 A * 1/1995

(Continued)

OTHER PUBLICATIONS

PCT/US2010/027558—International Search Report With Written Opinion, Mailing Date Oct. 27, 2010.

*Primary Examiner* — Robert J Hoffberg
(74) *Attorney, Agent, or Firm* — Barbara R. Doutre (57) ABSTRACT

A thermal-electrical assembly (200) provides with improved heat sinking, electrical shielding and electrical grounding. The thermal-electrical assembly is configured using a shield (202) having a windowed aperture (204), a pliable frame (206) formed of thermally and electrically conductive material having contours (210) that fit within and are retained by the windowed aperture, and a thermal insert (208) formed to fit within the pliable frame. The combination of pliable frame 206 and thermal insert (208) close off the shield (202) while providing contact areas for dissipating heat from heat generating circuitry or components. Communication devices, such as portable radios having tight space constraints, can incorporate the thermal-electrical assembly (200) to minimize electrical emissions while maximizing heat dissipation.

19 Claims, 5 Drawing Sheets

U.S. PATENT DOCUMENTS

| | | |
|---|---|---|
| 7,589,977 B2 * | 9/2009 | Lin .................... 361/816 |
| 2005/0111194 A1 | 5/2005 | Sohn |
| 2006/0133049 A1 * | 6/2006 | Hagiwara .................... 361/720 |
| 2006/0203453 A1 * | 9/2006 | Chen .................... 361/704 |
| 2007/0086170 A1 * | 4/2007 | Liang .................... 361/719 |
| 2007/0211445 A1 | 9/2007 | Robinson et al. |
| 2009/0073671 A1 * | 3/2009 | Lin .................... 361/816 |
| 2009/0091888 A1 * | 4/2009 | Lin et al. .................... 361/704 |

FOREIGN PATENT DOCUMENTS

| | | | |
|---|---|---|---|
| JP | 08116196 A | * | 5/1996 |
| JP | 08279689 A | * | 10/1996 |
| JP | 10070383 A | * | 3/1998 |
| WO | 0141521 A1 | | 6/2001 |

* cited by examiner

THERMAL-ELECTRICAL ASSEMBLY FOR A PORTABLE COMMUNICATION DEVICE

FIELD OF THE DISCLOSURE

The present disclosure relates generally to portable radio devices and more particularly to heat sinking, grounding and shielding of portable radio devices.

BACKGROUND

Electronic products typically have electrical circuitry implemented on a circuit substrate, such as a printed circuit board. The performance of the circuitry may be adversely affected by factors such as electromagnetic interference (EMI), radio frequency interference (RFI), electrostatic discharge (ESD), and environmental elements. The sources of interference may be internal or external to the product. For example, many electrical components emit radio frequency (RF) signals which may adversely affect the operation of other portions of the circuitry. Moreover, these RF signals may cause interference for other electronic devices operating nearby. A product designer may incorporate shields, or other protective devices, to protect critical portions of the circuitry, or specific components.

In addition to shielding, heat sinking of components must also be addressed in products utilizing heat dissipating components, such as power amplifiers. Proper grounding is also essential to achieving reliable shielding and heat sinking capabilities. The challenge of maintaining proper grounding along with proper shielding and heat sinking is significant when dealing with portable communication devices, such as battery operated portable radios, where space constraints, weight and cost are critical to the overall product design.

Accordingly, it would be beneficial to have an assembly that overcomes the aforementioned problems.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

In accordance with various embodiments to be described herein, there is provided a thermal-electrical assembly with improved heat sinking, electrical shielding and electrical grounding. The thermal-electrical assembly can be used in portable communication products having circuitry or components that generate heat and are susceptible to or generate electrical emissions, such as power amplifier circuitry and the like. Communication devices, such as handheld two-way radios and devices in which space and cost constraints are of concern, will benefit from the thermal-electrical assembly's ease of assembly and integrated planar aspects. Briefly, the thermal-electrical assembly is configured using a shield having a windowed aperture, a pliable frame formed of thermally and electrically conductive material contoured to fit within the windowed aperture, and a thermal insert formed to fit within the pliable frame. The combination of pliable frame and thermal insert close off the shield while providing contact areas for dissipating heat from heat generating circuitry or components.

Figure 1:
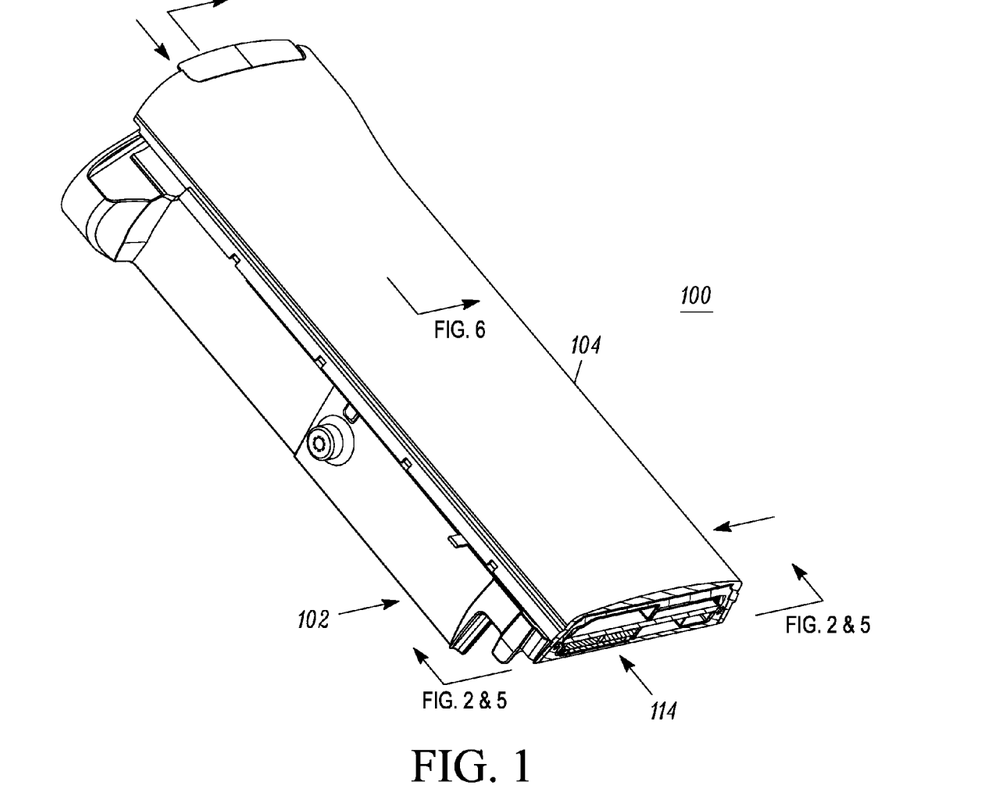
FIG. 1 illustrates a communication device within which a thermal-electrical assembly will be incorporated in accordance with an embodiment of the invention.
Figure 2:
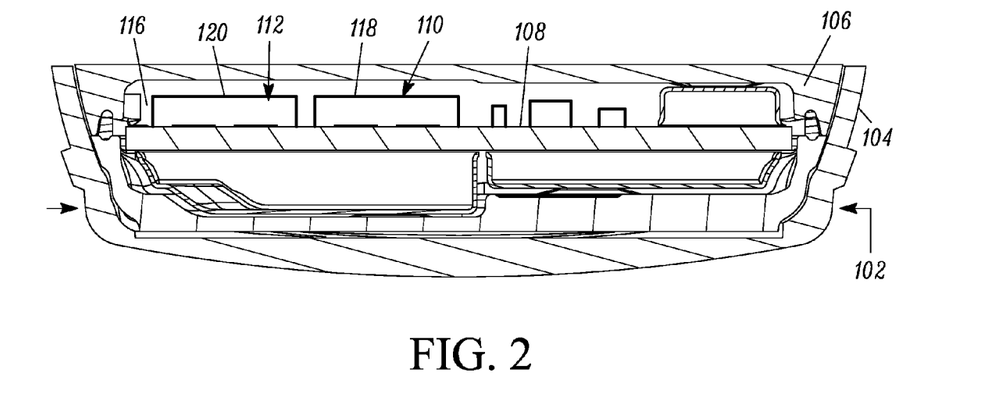
FIG. 2 illustrates a partial cross-sectional of the communication device without the thermal-electrical assembly.

FIG. 1 illustrates a portable communication device, in the form of a portable radio, within which a thermal-electrical assembly will be incorporated in accordance with an embodiment of the invention. Two cross sectional views 102, 114 will be described herein. Cross sectional view 102 will be shown and described with and without the thermal-electrical assembly in conjunction with FIGS. 2 and 5 while cross sectional view 114 will be describe in conjunction with FIG. 6. Referring to FIGS. 1 and 2, portable radio 100 is illustrated along cross section 102 and includes a housing 104, a chassis 106 coupled within the housing, and a substrate, shown as a densely populated printed circuit board (PCB) 108, mounted within the chassis. The PCB 108 includes a plurality of electrical components including at least one heat generating component 110. In the embodiment shown in FIG. 2, two side by side-by-side heat generating components 110, 112 are shown that require heat sinking. In this embodiment, components 110, 112 also require electrical ground contact on their respective upper surfaces 118, 120 as the components generate and/or are susceptible to electrical emissions. As seen in FIG. 2, space constraints 116 between components 110, 112 and the chassis 106 are very tight in terms of heat dissipation, but these same spaces 116 actually cause gaps and leak paths in terms of electrical emissions. The thermal-electrical assembly 200 shown in FIG. 3 addresses the need for heat dissipation, electrical shielding and grounding.

Figure 3:
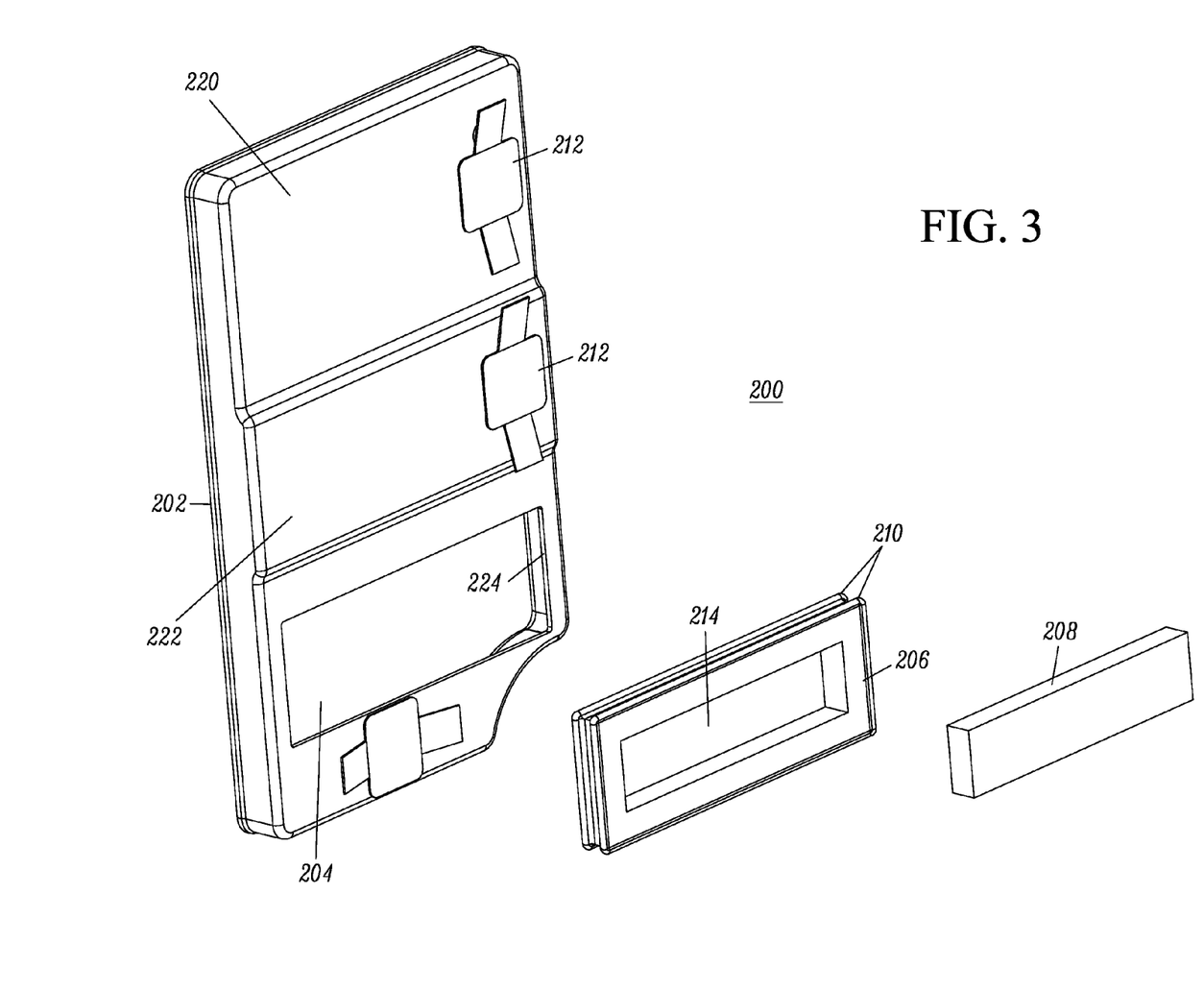
FIG. 3 illustrates an exploded view of a thermal-electrical assembly in accordance with an embodiment of the invention.

Referring to FIG. 3, an exploded view of thermal electrical-assembly 200 is shown in accordance with an embodiment.

Thermal-electrical assembly 200 is formed of a shield 202 having a windowed aperture 204, a pliable frame 206 formed of thermally and electrically conductive material for mounting about the windowed aperture and a thermal insert 208 for inserting and fitting within the pliable frame. Once assembled the pliable frame and thermal insert close off the shield.

The shield 202 can be formed of a variety of materials used in electrical shielding applications, such as a drawn or folded sheet metal, for example formed of cold rolled steel, Nickel Silver, or the like. In the embodiment shown in FIG. 3, the shield 202 is formed of various compartments 220, 222 of different heights to enclose components that have varying dimensions and/or emission susceptibilities. The compartments are separated by an interior divider wall (shown in later views) forming a can. Shield 204 may also include grounding tabs 212 disposed thereon to provide additional contact points between the shield and a heat sink, if desired.

Pliable frame 206 is formed of a thermal-electrical material, such as a silver impregnated silicon pad, or other material having both thermally dissipating and electrically conductive properties. Pliable frame 206 provides a predetermined cross-section 210 surrounding an opening 214. The pliable frame 206 is preferably formed of an extruded, die-cut member cut to have a very precise cross section 210. Pliable frame 206 may alternatively be a molded member. The predetermined cross section 210 is designed to provide assembly retention between the pliable frame 206 and the shield's aperture 204 while interior walls 216 of the pliable frame 206 are formed to provide a means of retaining thermal insert 208. In the embodiment shown in FIG. 3, the predetermined cross-section 210 is formed of contoured ridges, forming a gasket, within which to fit and retain edges 224 of the windowed aperture 204. The precise contoured cross section 210 is provides a "grip" to the edges of the aperture 204. The pliable frame 206 can thus be retained along the edges 224 of the aperture 204 while the thermal insert 208 is inserted within the aperture—all without the use of adhesives and taking up minimal space. While shown in a rectangular form, the shield's aperture 204, the pliable frame 206 and the thermal insert 208 can be formed of other shapes, as appropriate for the circuitry, components and heat sinking needs of other applications.

Thermal insert 208 is a non-electrically conductive, purely thermally conductive member. Thermal insert 208 is preferably formed of a die cut elastomer member composed of an aluminum oxide compound, thermally conductive gel, gap filling putty or the like. The thermal insert 208 is retained by friction within the pliable frame 206, thereby eliminating the need for any adhesives as mentioned above. Depending on the amount of heat dissipation desired for a particular application, the thermal insert 208 has substantially higher thermal properties than of the pliable frame 206. In some applications, thermal insert 208 may be on the order of, for example 17 W/m-k (watts per meter Kelvin as compared to the pliable frame 206, having thermal properties in the range of, for example 5-8 W/m-k. While the selection of thermal and electrical conductivity of the pliable frame 206 can be varied to suit the product and application, the thermal insert's 208 material properties should be selected to be purely thermal and non-electrically conductive so as to achieve maximum heat dissipating capability.

Figure 4A:
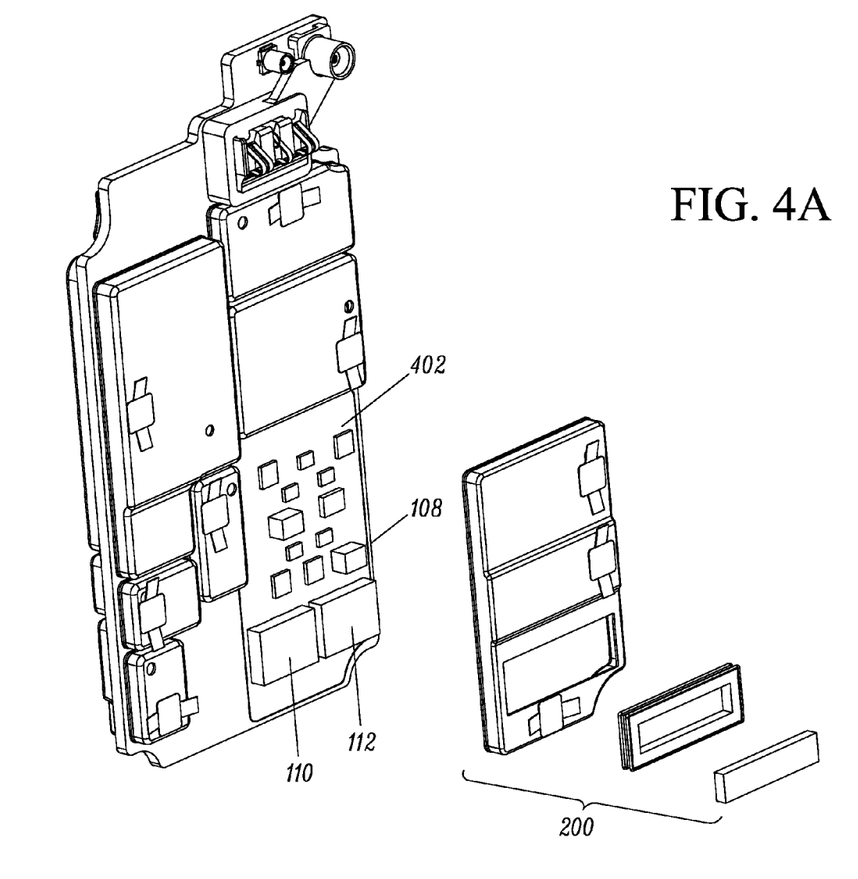
FIG. 4A illustrates a substrate upon which to mount the thermal-electrical assembly in accordance with an embodiment of the invention.
Figure 4B:
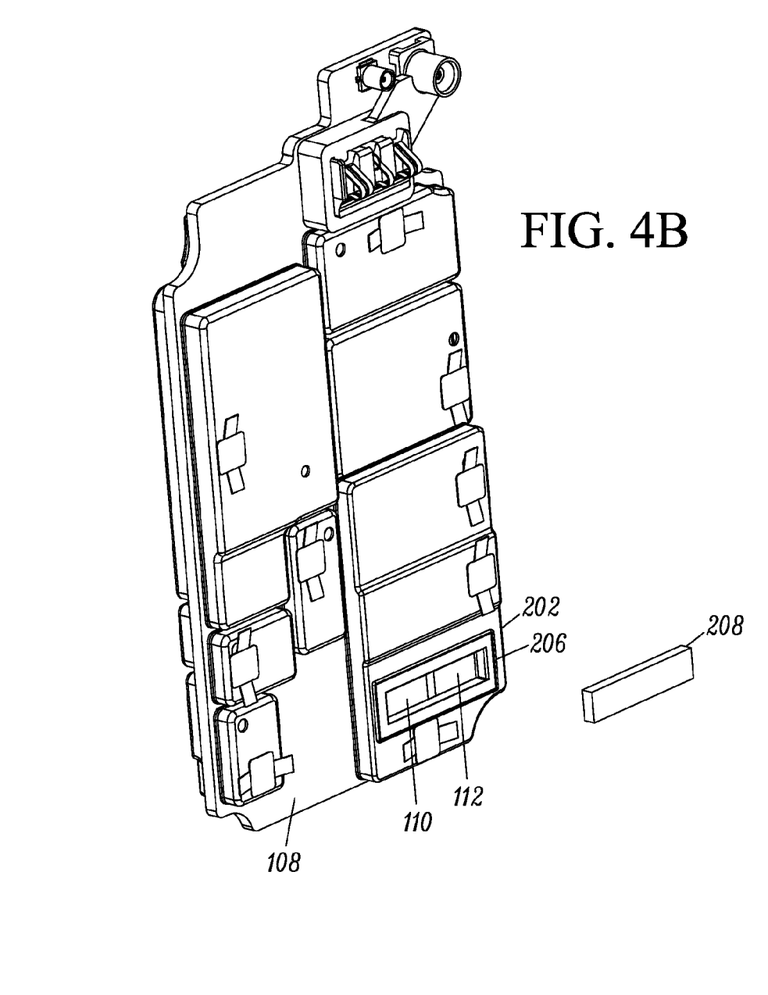
FIG. 4B illustrates the thermal-electrical assembly mounted to the substrate so as to expose a portion of circuitry through the pliable to be covered by the thermal insert in accordance with an embodiment of the invention.
Figure 4C:
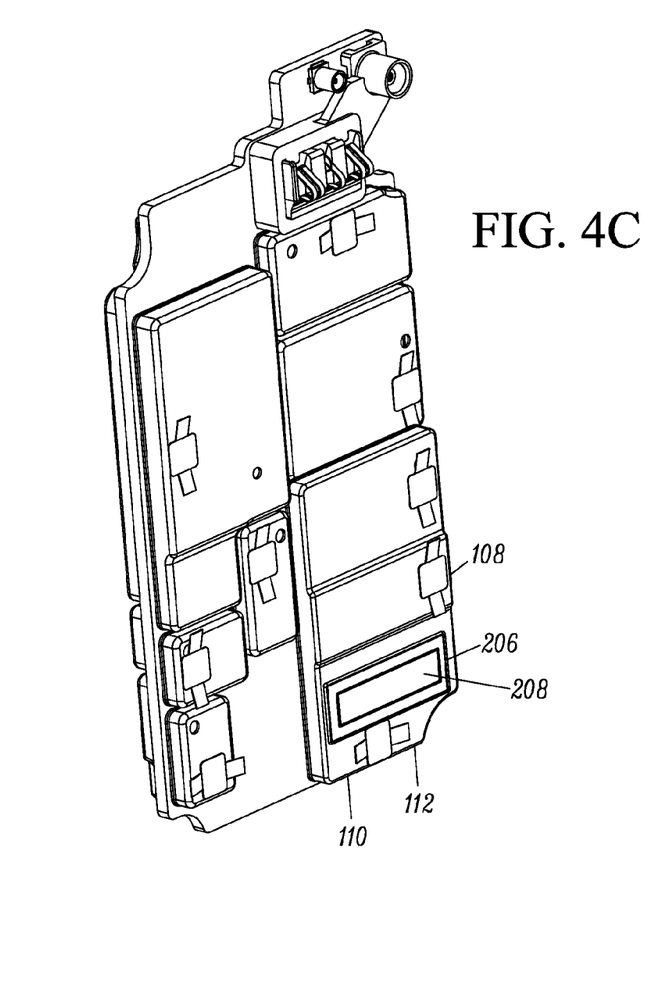
FIG. 4C illustrates the thermal-electrical assembly mounted to the substrate with the thermal insert inserted and retained within the pliable frame in accordance with an embodiment of the invention.

FIG. 4A illustrates a substrate, in the form of PCB 108, upon which to mount the thermal-electrical assembly 200 in accordance with an embodiment of the invention. This view more clearly shows circuitry in the form of densely populated circuitry sections 402, surrounded by a solderable track 404, situated next to the side-by-side heat generating components 110, 112. For the purposes of example, the densely populated circuitry 402 may provide driver circuitry for the heat generating components 110, 112 which may comprise power amplifier components. FIG. 4B illustrates the thermal-electrical assembly 200 mounted to the PCB 108 with the pliable frame 206 being mounted about the aperture 204 of shield 202 so as to expose a portion of the heat generating components 110, 112 within the opening 214 of the pliable frame. The thermal insert 208 is then inserted and retained, as seen in FIG. 4C, within the pliable frame's opening 214 so as to make contact with the exposed portions of the heat generating components 110, 112. The thermal insert 208 provides a path for improved dissipation of heat from the heat generating components 110, 112 while pliable frame 206 provides an electrically conductive path for improved grounding and shielding as well as, but to a lesser extent than the thermal insert 208, heat dissipation.

Figure 5:
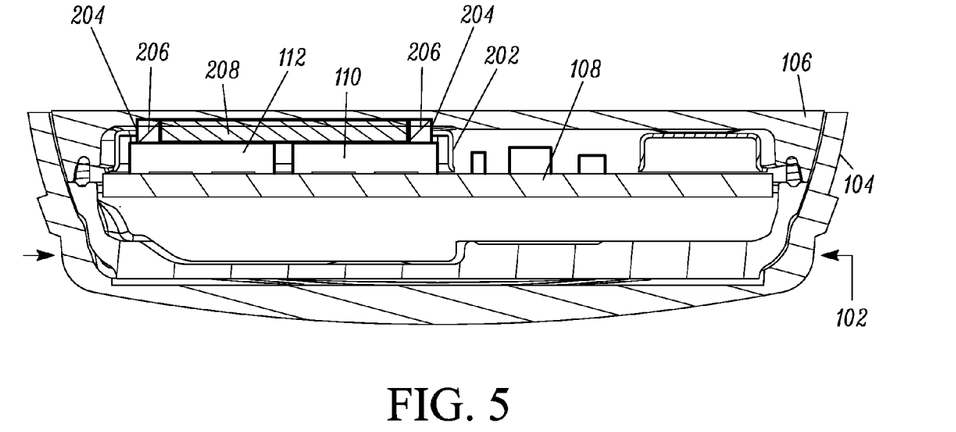
FIG. 5 illustrates the cross sectional view of FIG. 2 with the thermal-electrical assembly incorporated therein in accordance with an embodiment of the invention.
Figure 6:
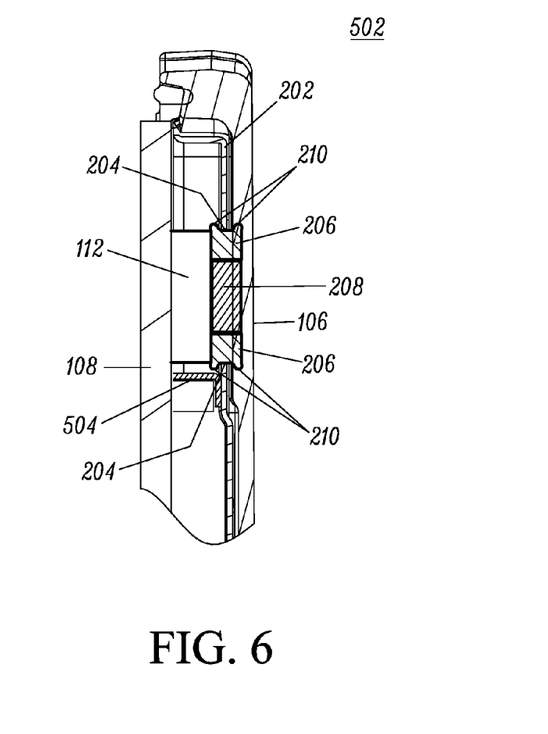
FIG. 6 illustrates another cross sectional view taken from another perspective of the communication device incorporating the thermal-electrical assembly therein in accordance with an embodiment of the invention.

Turning now to FIG. 5, the portable radio's cross-section 102 including the thermal-electrical assembly 200 is shown. FIG. 6 illustrates the vertical cross sectional view 114 of the portable radio 100 incorporating the thermal-electrical assembly 200 therein. Referring to FIGS. 5 and 6, there is shown housing 104, chassis 106 coupled within the housing, PCB 108 mounted within the housing and having a plurality of electrical components 110, 112, 402 including at least one heat dissipating component mounted thereon. In this embodiment, the heat generating components 110, 112 are preferably power amplifier components (PAs) separated from driver circuitry 402 via divider wall 504. Thermal assembly 200 includes shield 202 having aperture 204 formed therein, the shield being coupled, via soldering, to the PCB 108 covering the plurality of electrical components 110, 112, 402. the shield's aperture 204 at least partially exposes heat dissipating component 110, 112. The pliable frame 206, in the form of a thermally and electrically conductive gasket having opening 214, is formed of ridged outer side walls 210, the ridged outer side walls are coupled to the aperture 204 of the shield 202 such that the electrically and thermally conductive gasket couples to both the heat dissipating component 110, 112 and the chassis 106. The thermal insert 208 is coupled within the opening 214 of the thermally and electrically conductive gasket so as to contact the heat dissipating component 110, 112 and the chassis 106.

Assembled within the portable radio 100, the thermal-electrical assembly's pliable frame 206 makes contact with the shield 202, the top surfaces 118, 120 of heat generating components 110, 112 and the chassis 106 thereby providing a strong ground connection as well as emission protection in conjunction with thermal dissipation. The thermal insert 208 contacts the top surface 118, 120 of heat generating components 110, 112 and the chassis 106. The purely thermal characteristics of the thermal insert 208 provide a direct path through which to dissipate heat from the heat generating components 110, 112 to the chassis 106. The combination of shield having windowed aperture 204, and the placement of pliable frame 206 having thermal and electrical properties within that aperture along with the thermal insert's 208 highly heat dissipating properties provide improved grounding, shielding and thermal dissipation to circuitry that generates heat and is susceptible to electrical emissions. The selection of pliable and compressible materials for the thermal-electrical frame 206 and thermal insert 208 allows these members to be incorporated within the plane of the shield 202 yet extend sufficiently above and below the shield to provide a cushion-like interconnect to the desired surfaces of the chassis 106 and heat generating components 110, 112 thereby blocking access to gaps and leak paths.

The thermal-electrical assembly formed in accordance with the various embodiments is easily assembled without the use of adhesives thereby facilitating manufacturability. The thermal-electrical assembly provides a particularly effective means of providing heat dissipation in a fixed displacement mechanical design in conjunction with effective shielding and grounding to the top surfaces of components. Communication devices, such as portable radios having tight space constraints, can incorporate the thermal-electrical assembly to simultaneously minimize electrical emissions while maximizing heat dissipation.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A communication device, comprising:
   a housing;
   a chassis coupled within the housing; a printed circuit board (PCB) mounted within the chassis, the PCB having a plurality of electrical components including at least one heat dissipating component mounted thereon;
   a shield having an aperture formed therein, the shield being coupled to the PCB over the plurality of electrical components such that the aperture exposes the at least one heat dissipating component;
   a thermally and electrically conductive gasket formed of ridged outer side walls having an opening formed therein, the ridged outer side walls coupled to the aperture of the shield such that the thermally and electrically conductive gasket couples to both the at least one heat dissipating component and the chassis; and
   a thermal insert coupled within the opening of the thermally and electrically conductive gasket so as to contact the at least one heat dissipating component and the chassis.

2. The communication device of claim 1, further comprising a plurality of ground tabs coupled to the shield and making contact to the chassis.

3. The communication device of claim 1, wherein the thermally and electrically conductive gasket and the thermal insert are non-adhesive.

4. The communication device of claim 1, wherein the thermal insert has thermal properties higher than those of the thermally and electrically conductive gasket.

5. The communication device of claim 1, wherein the thermal insert is non-electrically conductive.

6. The communication device of claim 1, wherein the thermally and electrically conductive gasket provides electrical grounding and electrical shielding to the at least one heat dissipating component.

7. The communication device of claim 1, wherein the communication device comprises a portable hand-held radio.

8. The communication device of claim 1, wherein the at least one heat dissipating component comprises a power amplifier.

9. The communication device of claim 1, wherein the shield includes a divider wall dividing the shield into a plurality of interior compartments.

10. The communication device of claim 9, wherein the plurality of components includes a power amplifier and a driver circuitry, and wherein the power amplifier is the at least one heat dissipating component.

11. The communication device of claim 10, wherein the plurality of interior compartments of the shield divide the power amplifier from the driver circuitry.

12. The communication device of claim 1, wherein the at least one heat dissipating component is grounded to the chassis.

13. A thermal-electrical assembly for a plurality of electrical components, comprising:
   a housing;
   a metal chassis coupled to the housing;
   a printed circuit board having a solderable track surrounding the plurality of components, the printed circuit board being mounted within the metal chassis;

a shield soldered to the solderable track, the shield having an aperture formed therein exposing a heat dissipating component of the plurality of electrical components;

a gasket having electrically and thermally conductive properties, the gasket having contoured edges within which to mount in the aperture of the shield such that the gasket makes contact with the shield and the heat dissipating component, the gasket having an opening; and a thermal insert mounted in the opening of the gasket and be retained by the gasket, the thermal insert making contact with the heat dissipating component, the gasket and the thermal insert configured to fill the aperture of the shield.

14. The thermal-electrical assembly of claim 13, wherein the thermal insert has thermally conductive properties higher than those of the gasket.

15. The thermal-electrical assembly of claim 14, wherein the thermal insert is non-electrically conductive.

16. The thermal-electrical assembly of claim 15, wherein the gasket and the thermal insert are non-adhesive.

17. The thermal-electrical assembly of claim 16, wherein the shield includes a divider wall dividing the shield into first and second compartments, the first compartment having the aperture and exposing the heat dissipating component, and the second compartment enclosing all other components of the plurality of electrical components.

18. The thermal-electrical assembly of claim 13, wherein the gasket also makes contact to the metal chassis for grounding and heat sinking, and the thermal insert makes contact to the metal chassis for heat sinking.

19. A communication device, comprising:

a substrate having electrical power amplification components mounted thereon, at least a portion of the electrical power amplification components are heat generating components;

a metal chassis mounted within the communication device, the substrate being mounted within the metal chassis;

a shield mounted to the substrate over the electrical power amplification components and beneath the metal chassis, the shield having a windowed aperture exposing at least a portion of the heat generating components;

a pliable frame formed of thermally and electrically conductive material mounted in the windowed aperture and contacting the exposed the at least a portion of the heat generating components and the metal chassis, the pliable frame contacts the metal chassis thereby providing electrical ground to the shield; and a non-electrically conductive thermal insert formed to fit and mount within the pliable frame, the pliable frame and the non-electrically conductive thermal insert closing off the shield and contacting the exposed at least a portion of the heat generating components and the metal chassis, and the metal chassis providing heat dissipation to the exposed at least a portion of the heat generating components through the non-electrically conductive thermal insert.

* * * * *